United States Patent
Okamoto et al.

(10) Patent No.: US 11,895,769 B2
(45) Date of Patent: Feb. 6, 2024

(54) MODULE, TERMINAL ASSEMBLY, AND METHOD FOR PRODUCING MODULE

(71) Applicant: Murata Manufacturing Co., Ltd., Kyoto (JP)

(72) Inventors: Kazuya Okamoto, Kyoto (JP); Takashi Haga, Kyoto (JP); Masayoshi Takagi, Kyoto (JP); Kazushige Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 170 days.

(21) Appl. No.: 17/480,429

(22) Filed: Sep. 21, 2021

(65) Prior Publication Data
US 2022/0007499 A1   Jan. 6, 2022

Related U.S. Application Data

(63) Continuation of application No. PCT/JP2020/006034, filed on Feb. 17, 2020.

(30) Foreign Application Priority Data

Apr. 3, 2019   (JP) .................. 2019-071534

(51) Int. Cl.
*H05K 1/02* (2006.01)
*H01R 12/52* (2011.01)
*H01R 13/52* (2006.01)

(52) U.S. Cl.
CPC ........... *H05K 1/0213* (2013.01); *H01R 12/52* (2013.01); *H01R 13/5219* (2013.01); *H05K 2203/1147* (2013.01)

(58) Field of Classification Search
CPC ......... H05K 1/0213; H05K 2203/1147; H01R 12/52; H01R 13/5219
(Continued)

(56) References Cited

U.S. PATENT DOCUMENTS 4,879,630 A * 11/1989 Boucard ........... H01L 23/49575
257/713
7,663,465 B2 * 2/2010 Matsumoto .......... H01H 85/044
337/187

(Continued)

FOREIGN PATENT DOCUMENTS

CN      111566805 A    8/2020
JP    2012-015216 A    1/2012
(Continued)

OTHER PUBLICATIONS

International Search Report for PCT/JP2020/006034 dated May 12, 2020.

*Primary Examiner* — Anatoly Vortman
(74) *Attorney, Agent, or Firm* — Pearne & Gordon LLP

(57) ABSTRACT

A module according to the present disclosure includes a circuit board, an electronic component on one of two principal surfaces of the circuit board, a connection conductor on the principal surface of the circuit board, and sealing resin on the principal surface of the circuit board. The electronic component and the connection conductor are covered with the sealing resin. The connection conductor includes a plate-shaped conductor and terminal sections. The plate-shaped conductor is disposed upright on the principal surface of the circuit board. The terminal sections extend from the plate-shaped conductor and away from the principal surface of the circuit board and are arranged side by side. Tip portions of the terminal sections are exposed at a surface of the sealing resin.

14 Claims, 21 Drawing Sheets

(58) Field of Classification Search
USPC .......................................................... 174/250
See application file for complete search history.

(56) References Cited

U.S. PATENT DOCUMENTS

| | | | | |
|---|---|---|---|---|
| 7,808,796 | B2* | 10/2010 | Hatanaka | H01L 25/165 |
| | | | | 361/760 |
| 9,491,846 | B2* | 11/2016 | Ogawa | H01L 23/3121 |
| 10,999,956 | B2* | 5/2021 | Otsubo | H05K 5/065 |
| 2012/0139089 | A1 | 6/2012 | Huang et al. | |
| 2012/0160547 | A1* | 6/2012 | Antesberger | H05K 3/462 |
| | | | | 174/250 |
| 2014/0262442 | A1* | 9/2014 | Nomura | H05K 1/113 |
| | | | | 427/97.8 |
| 2019/0215993 | A1* | 7/2019 | Yagi | H01L 23/04 |
| 2019/0229027 | A1* | 7/2019 | Nomiyama | H01L 23/3121 |
| 2019/0318974 | A1* | 10/2019 | Fujikawa | H01L 23/36 |
| 2019/0364660 | A1* | 11/2019 | Sato | H01L 21/56 |
| 2020/0058599 | A1* | 2/2020 | Okada | H01L 21/561 |
| 2020/0343151 | A1 | 10/2020 | Nomura et al. | |
| 2021/0280503 | A1* | 9/2021 | Sato | H01L 23/49822 |

FOREIGN PATENT DOCUMENTS

| | | | |
|---|---|---|---|
| WO | 2013/035716 | A1 | 3/2013 |
| WO | 2019/138895 | A1 | 7/2019 |

* cited by examiner

MODULE, TERMINAL ASSEMBLY, AND METHOD FOR PRODUCING MODULE

CROSS REFERENCE TO RELATED APPLICATION

This is a continuation of International Application No. PCT/JP2020/006034 filed on Feb. 17, 2020 which claims priority from Japanese Patent Application No. 2019-071534 filed on Apr. 3, 2019. The contents of these applications are incorporated herein by reference in their entireties.

BACKGROUND OF THE DISCLOSURE

Field of the Disclosure

The present disclosure relates to a module, a terminal assembly, and a method for producing a module.

Description of the Related Art

A method by which a module including connection conductors is produced at low cost and in a short time is proposed in, for example, Patent Document 1. According to Patent Document 1, a terminal assembly including connection conductors linked to each other with a link section therebetween is mounted onto a circuit board, on which the terminal assembly is sealed with resin, and the link section is then removed.

Patent Document 1: International Publication No. 2013/035716

BRIEF SUMMARY OF THE DISCLOSURE

The downside to the method disclosed in Patent Document 1 is that the connection conductors are each in the form of a rectangular prism (thin plate) and can thus slip out of the sealing resin after the removal of the link section from the terminal assembly mounted on the circuit board.

The present disclosure therefore has been made in view of the aforementioned problem, and it is an object of the present disclosure to provide a module, a terminal assembly, and a method for producing a module, with the adhesion of a connection conductor to sealing resin being enhanced to eliminate or reduce the possibility that the connection conductor will slip out of the sealing resin.

A module according to the present disclosure that has been made to solve the aforementioned problem includes a circuit board, an electronic component on one of two principal surfaces of the circuit board, a connection conductor on the principal surface of the circuit board, and sealing resin on the principal surface of the circuit board. The electronic component and the connection conductor are covered with the sealing resin. The connection conductor includes a plate-shaped conductor and terminal sections. The plate-shaped conductor is disposed upright on the principal surface of the circuit board. The terminal sections extend from the plate-shaped conductor and away from the principal surface of the circuit board and are arranged side by side. Tip portions of the terminal sections are exposed at a surface of the sealing resin.

A terminal assembly according to the present disclosure that has been made to solve the aforementioned problem includes a first connection conductor, a second connection conductor, and link sections. The first connection conductor includes a first plate-shaped conductor. The second connection conductor includes a second plate-shaped conductor that faces the first plate-shaped conductor. The first connection conductor includes first terminal sections that extend from the first plate-shaped conductor and away from one of two opposite end portions of the first plate-shaped conductor and are arranged side by side. The link sections link tip portions of the first terminal sections to the second connection conductor and are arranged with a space therebetween.

A method for producing a module according to the present disclosure that has been made to solve the aforementioned problem includes the steps of: preparing a terminal assembly that includes a first connection conductor including a first plate-shaped conductor, a second connection conductor including a second plate-shaped conductor, first terminal sections extending from the first plate-shaped conductor and away from one of two opposite end portions of the first plate-shaped conductor and being arranged side by side, and link sections linking tip portions of the first terminal sections to one of two opposite end portions of the second connection conductor and being arranged with a space therebetween; mounting the terminal assembly in such a manner that the other end portion of the first connection conductor and the other end portion of the second connection conductor are connected to one of two principal surfaces of a circuit board and mounting an electronic component onto the principal surface of the circuit board; sealing the electronic component and the terminal assembly with resin; and removing sealing resin in such a way as to remove the resin and the link sections to expose the tip portions of the first terminal sections at a surface of the resin.

The present disclosure enables enhancement of the adhesion of the connection conductor to the sealing resin, thus eliminating or reducing the possibility that the connection conductor will slip out of the sealing resin.

DETAILED DESCRIPTION OF THE DISCLOSURE

Figure 1:
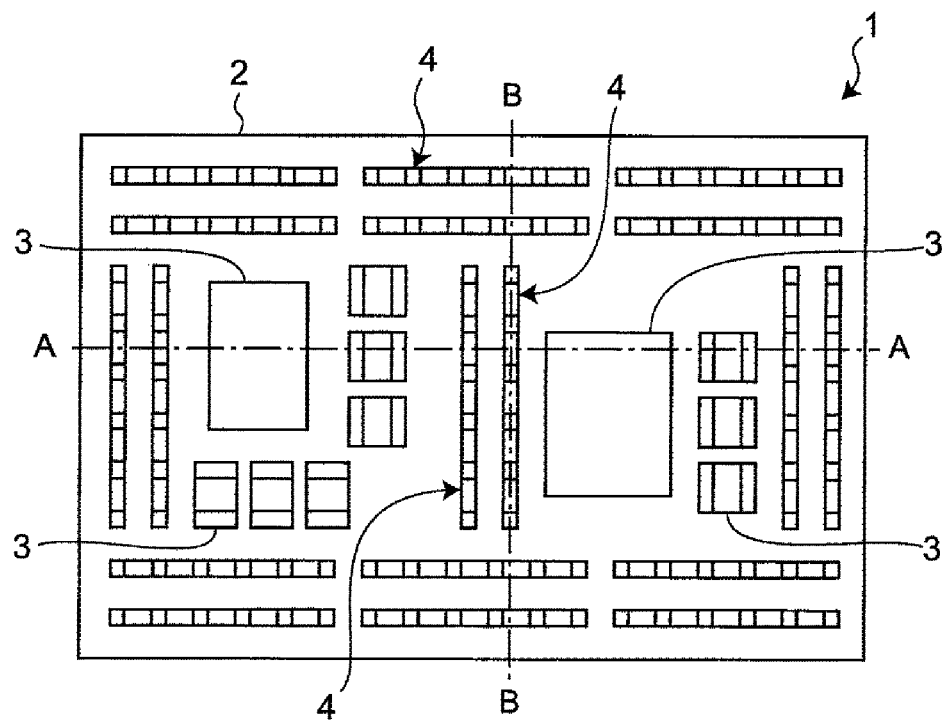
FIG. 1 is a plan view of a module according to an embodiment.

According to a first aspect of the present disclosure, a module includes a circuit board, an electronic component on one of two principal surfaces of the circuit board, a connection conductor on the principal surface of the circuit board, and sealing resin on the principal surface of the circuit board. The electronic component and the connection conductor are covered with the sealing resin. The connection conductor includes a plate-shaped conductor and terminal sections. The plate-shaped conductor is disposed upright on the principal surface of the circuit board. The terminal sections extend from the plate-shaped conductor and away from the principal surface of the circuit board and are arranged side by side. Tip portions of the terminal sections are exposed at a surface of the sealing resin.

The terminal sections provided to the plate-shaped conductor are arranged side by side, with a space being provided therebetween and being filled with the sealing resin. The adhesion of the connection conductor to the sealing resin is thus enhanced such that the connection conductor is less likely to slip out of the sealing resin.

According to a second aspect of the present disclosure, the module according to the first aspect is as follows: the connection conductor includes support sections that extend from the plate-shaped conductor toward the principal surface of the circuit board and are arranged side by side, and the support sections are electrically connected to an electrode on the circuit board. When being poured, sealing resin flows into spaces between adjacent ones of the support sections. The adhesion of the connection conductor to the sealing resin is thus enhanced such that the connection conductor is less likely to slip out of the sealing resin.

According to a third aspect of the present disclosure, the module according to the second aspect is as follows: the gross area of regions where the support sections are in contact with the electrode is greater than the gross area of regions where the tip portions of the terminal sections are exposed at the surface of the sealing resin. The increase in the area of regions where the support sections are in contact with the electrode leads to an enhancement of the adhesion between the connection conductor and the electrode on the circuit board such that the connection conductor is less likely to slip out of the sealing resin.

According to a fourth aspect, a terminal assembly according to the present disclosure includes a first connection conductor, a second connection conductor, and link sections. The first connection conductor includes a first plate-shaped conductor. The second connection conductor includes a second plate-shaped conductor that faces the first plate-shaped conductor. The first connection conductor includes first terminal sections that extend from the first plate-shaped conductor and away from one of two opposite end portions of the first plate-shaped conductor and are arranged side by side. The link sections link tip portions of the first terminal sections to the second terminal conductor and are arranged with a space therebetween.

The first terminal sections provided to the first plate-shaped conductor are arranged side by side, with a space being provided therebetween and being filled with the sealing resin. The adhesion of the first connection conductor to the sealing resin is thus enhanced such that the first connection conductor is less likely to slip out of the sealing resin.

According to a fifth aspect of the present disclosure, the terminal assembly according to the fourth aspect is as follows. The second connection conductor includes second terminal sections that extend from the second plate-shaped conductor and away from one of two opposite end portions of the second plate-shaped conductor and are arranged side by side. The link sections link the tip portions of the first terminal sections to tip portions of the second terminal sections and are arranged with a space therebetween. This layout enables smooth entry of the sealing resin into the spaces between adjacent ones of the first terminal sections and into the spaces between adjacent ones of the second terminal sections. The adhesion of the first connection conductor to the sealing resin and the adhesion of the second connection conductor to the sealing resin are thus enhanced such that the first connection conductor and the second connection conductor are less likely to slip out of the sealing resin.

According to a sixth aspect of the present disclosure, the terminal assembly according to the fourth aspect or the fifth aspect also includes a resin block that holds the first plate-shaped conductor, the first terminal sections, and the link sections. The first plate-shaped conductor, the first terminal sections, and the link sections are arranged along surfaces around a perimeter of the resin block. The link sections are removed by polishing or the like in a state in which the first plate-shaped conductor and the first terminal sections are held by the resin block. The terminal assembly may thus be mounted on a circuit board more easily than would be possible if the first plate-shaped conductor and the first terminal sections are handled independently of one another.

According to a seventh aspect of the present disclosure, a method for producing a module includes the steps of: preparing a terminal assembly that includes a first connection conductor including a first plate-shaped conductor, a second connection conductor including a second plate-shaped conductor, first terminal sections extending from the first plate-shaped conductor and away from one of two opposite end portions of the first plate-shaped conductor and being arranged side by side, and link sections linking tip portions of the first terminal sections to one of two opposite end portions of the second connection conductor and being arranged with a space therebetween; mounting the terminal assembly in such a manner that the other end portion of the first connection conductor and the other end portion of the second connection conductor are connected to one of two principal surfaces of a circuit board and mounting an electronic component onto the principal surface of the circuit board; sealing the electronic component and the terminal assembly with resin; and removing sealing resin in such a way as to remove the resin and the link sections to expose the tip portions of the first terminal sections at a surface of the resin.

This production method offers the following advantage. The first terminal sections provided to the first plate-shaped conductor are arranged side by side, with a space being provided therebetween and being filled with resin. The adhesion of the first connection conductor to the resin is thus enhanced such that the first connection conductor is less likely to slip out of the resin.

According to an eighth aspect of the present disclosure, the method for producing a module according to the seventh aspect is as follows. The terminal assembly also includes a suction part that connects the link sections to each other. The step of mounting includes a suction step in which the terminal assembly is mounted onto the circuit board in such a manner that the suction part of the terminal assembly is sucked. In the step of removing sealing resin, the link sections and the suction part are removed. This production method is advantageous in that, with the suction part of the terminal assembly being sucked, the terminal assembly may be mounted more stably onto the circuit board.

According to the ninth aspect of the present disclosure, the method for producing a module according to the seventh or eighth aspect is as follows. The terminal assembly includes a resin block that holds the first plate-shaped conductor, the first terminal sections, and the link sections. The first plate-shaped conductor, the first terminal sections, and the link sections are arranged along surfaces around a perimeter of the resin block. The link sections are removed by polishing or the like in a state in which the first plate-shaped conductor and the first terminal sections are held by the resin block. Thus, this production method is advantageous in that the terminal assembly may be mounted on a circuit board more easily than would be possible if the first plate-shaped conductor and the first terminal sections are handled independently of one another.

According to a tenth aspect of the present disclosure, the method for producing a module according to any one of the seventh to ninth aspects is as follows. In the step of preparing the terminal assembly, the second connection conductor includes second terminal sections that extend from the second plate-shaped conductor and away from one of two opposite end portions of the second plate-shaped conductor and are arranged side by side. The link sections link the tip portions of the first terminal sections to tip portions of the second terminal sections and are arranged with a space therebetween. This production method enables smooth entry of the sealing resin into the spaces between adjacent ones of the first terminal sections and into the spaces between adjacent ones of the second terminal sections. The adhesion of the first connection conductor to the sealing resin and the adhesion of the second connection conductor to the sealing resin are thus enhanced such that the first connection conductor and the second connection conductor are less likely to slip out of the sealing resin.

Embodiments of the present disclosure will be described below in detail with reference to the accompanying drawings.

First Embodiment

Module 1

Figure 2:
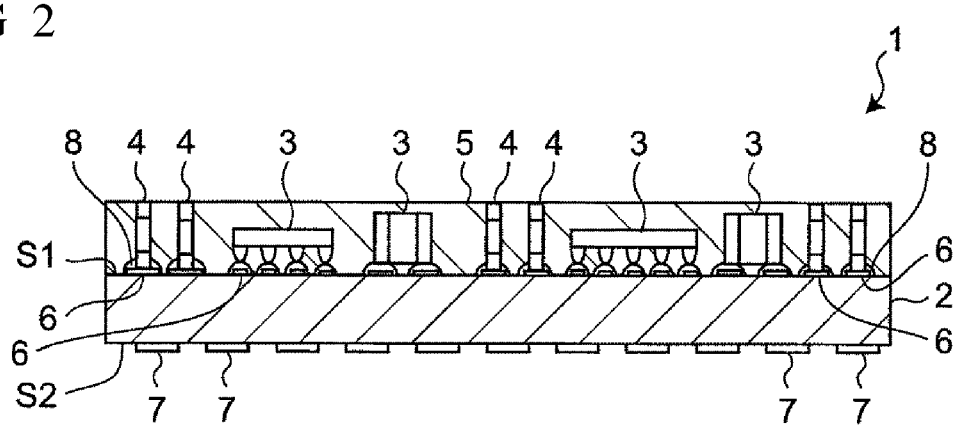
FIG. 2 is a sectional view of the module taken along line A-A in FIG. 1.
Figure 3:
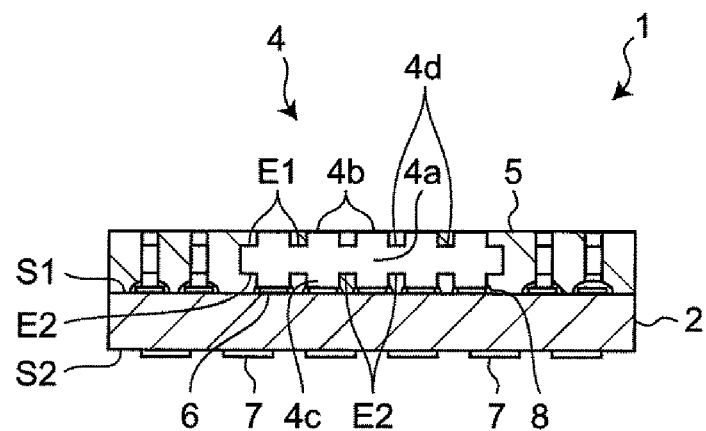
FIG. 3 is a sectional view of the module taken along line B-B in FIG. 1.

The following describes a module 1 according to an embodiment of the present disclosure with reference to FIGS. 1, 2, and 3. FIG. 1 is a plan view of the module 1 according to the present embodiment. FIG. 2 is a sectional view of the module 1 taken along line A-A in FIG. 1. FIG. 3 is a sectional view of the module 1 taken along line B-B in FIG. 1.

As illustrated in FIGS. 1, 2, and 3, the module 1 includes a circuit board 2, electronic components 3, connection conductors 4, and sealing resin 5. The electronic components 3 and the connection conductors 4 are mounted on the circuit board 2. The electronic components 3 and the connection conductors 4 are sealed with the sealing resin 5. The module 1 is to be mounted on, for example, a motherboard of a communication mobile terminal. More specifically, the module 1 finds application to various kinds of communication modules, such as Bluetooth (registered trademark) modules and wireless LAN modules. The module 1 also finds application to radio-frequency circuit modules, such as antenna switch modules and power supply modules.

The circuit board 2 is made of an insulating material, examples of which include low-temperature co-fired ceramics and glass epoxy resin. Ground electrodes (not illustrated), wiring electrodes (not illustrated), and via conductors (not illustrated) are disposed on principal surfaces of the circuit board 2 or within the circuit board 2. In the present embodiment, the electronic components 3 and the connection conductors 4 are mounted on one of two principal surfaces of the circuit board 2 (i.e., on a front surface S1 of the circuit board 2), and electrodes 7 are disposed on the other principal surface of the circuit board 2 (i.e., on a back surface S2 of the circuit board 2). The front surface S1 of the circuit board 2 is overlaid with the sealing resin 5, which covers the electronic components 3 and the connection conductors 4. The ground electrodes and the wiring electrodes on or within the circuit board 2 are screen-printed with conductive paste containing metal, such as Cu, Ag, or Al. The via conductors may be obtained by forming via holes under laser radiation, followed by a well-known procedure.

Examples of the electronic components 3 include inductor elements, capacitors, integrated circuits (ICs), and power amplifiers. The electronic components 3 in the present embodiment are electrically connected to electrodes 6, which are disposed on the front surface S1 of the circuit board 2. A conductive bonding material 8, which may be solder, is provided between each of the electronic components 3 and the corresponding electrodes 6.

The connection conductors 4 are intended for keeping extraneous radio waves from entering the electronic components 3 or for connecting the circuit board 2 to an external motherboard (not illustrated). The connection conductors 4 are made of metal, such as Steel Use Stainless (SUS) or copper. Referring to FIG. 3, the connection conductors 4 each include a plate-shaped conductor 4a, which is substantially rectangular when viewed in section. The connection conductors 4 each include terminal sections 4b. The terminal sections 4b are provided to an end portion E1, which is one of two end portions of the plate-shaped conductor 4a in the short-side direction. The terminal sections 4b extend away from the front surface S1 of the circuit board 2. The terminal sections 4b are arranged with a space therebetween in the longitudinal direction of the plate-shaped conductor 4a. The connection conductors 4 in the present embodiment each include support sections 4c. The support sections 4c are provided to an end portion E2, which is the other end portion of the plate-shaped conductor 4a in the short-side direction. The support sections 4c extend toward the front surface S1 of the circuit board 2. The support sections 4c are arranged with a space therebetween in the longitudinal direction of the plate-shaped conductor 4a. The support sections 4c are electrically connected to the electrodes 6 on the front surface S1 of the circuit board 2, with the conductive bonding material 8 being provided between each of the support sections 4c and the corresponding electrode 6. The conductive bonding material 8 may be solder.

The support sections 4c of each of the connection conductors 4 in the present embodiment are optional; that is, the plate-shaped conductors 4a and the electrodes 6 on the front surface S1 of the circuit board 2 may have surface contact in such a manner as to form electrical connection therebetween.

As illustrated in FIGS. 2 and 3, the plate-shaped conductors 4a are disposed upright on the front surface S1 of the circuit board 2. The plate-shaped conductors 4a may each be in the form of a rectangular plate. The plate-shaped conductors 4a in the present embodiment are each rectangular when viewed in section. The plate-shaped conductor 4a is provided with the terminal sections 4b, which extend away from the front surface S1 of the circuit board 2. In other words, the terminal sections 4b of each of the plate-shaped conductors 4a are protrusions that extend away from the front surface S1 of the circuit board 2. The plate-shaped conductors 4a each have recesses 4d, each of which is located between the terminal sections 4b arranged in the longitudinal direction. The terminal sections 4b are arranged side by side in the longitudinal direction of the plate-shaped conductor 4a. In the present embodiment, each of the plate-shaped conductors 4a and the terminal sections 4b provided thereto are formed monolithically. Alternatively, the plate-shaped conductor 4a and the terminal sections 4b may be formed separately and may be then bonded together with a conductive adhesive, such as solder. As illustrated in FIG. 3, the plate-shaped conductor 4a is provided with the terminal sections 4b, which are arranged side by side in the longitudinal direction of the plate-shaped conductor 4a.

The electrodes 6 on the front surface S1 of the circuit board 2 may, for example, be connected to the ground potential. As illustrated in FIG. 1, the connection conductors 4 in the present embodiment are arranged in a manner so as to surround the electronic components 3. This layout enables the connection conductors 4 to suppress electromagnetic interference between the electronic components 3. For example, the electronic components 3 surrounded by the connection conductors 4 are impervious extraneous noise, and the connection conductors 4 also suppress the leakage of the noise produced by the electronic components 3. Referring to FIG. 1, the connection conductors 4 are spaced apart from each other. Alternatively, the connection conductors 4 may be disposed with no space therebetween. The connection conductors 4 may be arranged in a manner so as to form two or more loops around the electronic components 3, as illustrated in FIG. 1. The electronic components 3 surrounded by the connection conductors 4 arranged as described above are more impervious to extraneous noise.

The sealing resin 5 is intended for protecting the electronic components 3 and the connection conductors 4 against, for example, externally exerted physical impacts. As illustrated in FIG. 3, the sealing resin 5 in the present embodiment is provided on the front surface S1 of the circuit board 2 in a manner so as to cover the sites of the connection between the circuit board 2 and the electronic components 3, the sites of the connection between the circuit board 2 and the connection conductors 4, the individual electronic components 3, and the individual connection conductors 4.

In the present embodiment, the spaces between adjacent ones of the terminal sections 4b of each of the connection conductors 4 are filled with the sealing resin 5. In other words, the recesses 4d, each of which is located between adjacent ones of the terminal sections 4b, are filled with the sealing resin 5. With the tip portions of the terminal sections 4b of the connection conductor 4 being exposed, the sealing resin 5 in the recesses 4d of the connection conductor 4 will eliminate or reduce the possibility that the connection conductor 4 will slip out of the sealing resin 5.

The connection conductors 4 of the module 1 according to the present embodiment each include the plate-shaped conductor 4a and the terminal sections 4b. The plate-shaped conductor 4a is disposed upright on the principal surface S1, which is one of two principal surfaces of the circuit board 2. The terminal sections 4b extend from the plate-shaped conductor 4a and away from the principal surface S1 of the circuit board 2 and are arranged side by side. The terminal sections 4b provided to the plate-shaped conductor 4a are arranged side by side, with a space being provided therebetween and being filled with the sealing resin 5. The adhesion of the connection conductors 4 to the sealing resin 5 is thus enhanced such that the connection conductors 4 are less likely to slip out of the sealing resin 5.

The connection conductors 4 of the module 1 according to the present embodiment each include the support sections 4c, which extend from the plate-shaped conductor 4a toward the principal surface S1 of the circuit board 2 and are arranged side by side. The support sections 4c are electrically connected to the electrodes 6 on the circuit board 2. When being poured, the sealing resin 5 flows into the spaces between adjacent ones of the support sections 4c. The adhesion of the connection conductors 4 to the sealing resin 5 is thus enhanced such that the connection conductors 4 are less likely to slip out of the sealing resin 5.

Terminal Assembly 10

Figure 4:
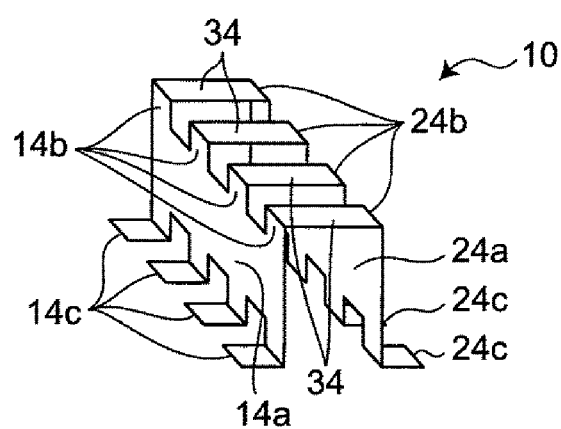
FIG. 4 is a perspective view of a terminal assembly.
Figure 5:
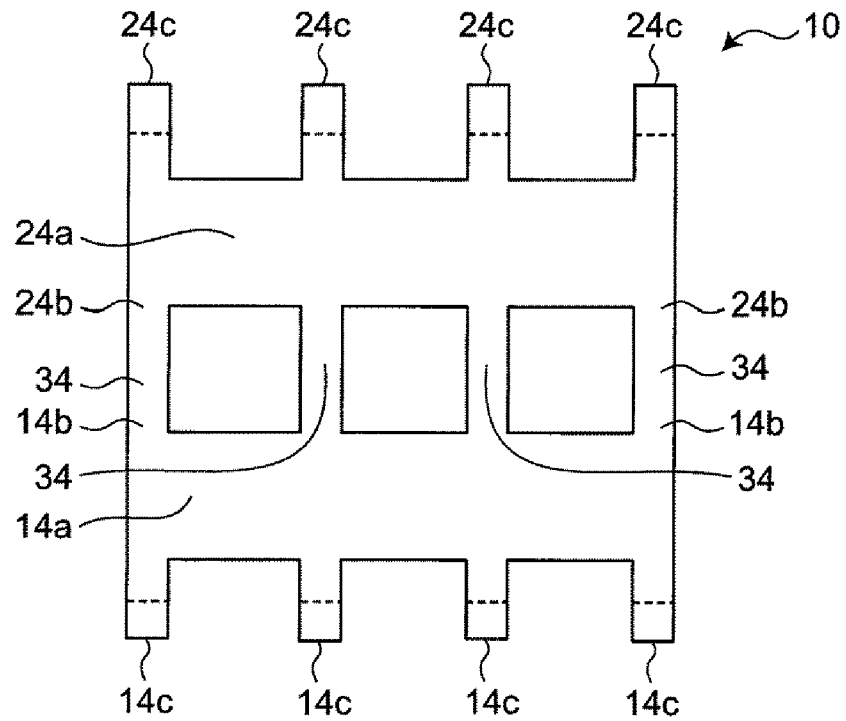
FIG. 5 is a development view of the terminal assembly illustrated in FIG. 4.
Figure 6:
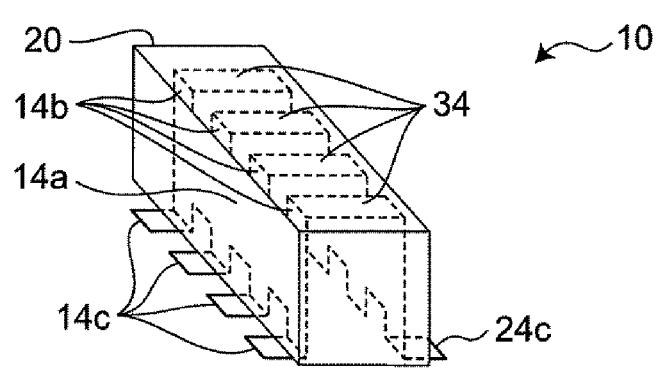
FIG. 6 is a perspective view of a terminal assembly including a resin block.

The following describes a method for forming the connection conductors 4. In the present embodiment, more than one connection conductor 4 is included in a terminal assembly 10. The terminal assembly 10 will be described in more detail with reference to FIGS. 4, 5, and 6. FIG. 4 is a perspective view of the terminal assembly 10. FIG. 5 is a development view of the terminal assembly 10 illustrated in FIG. 4. FIG. 6 is a perspective view of the terminal assembly 10 including a resin block 20. FIGS. 4 and 6 illustrate the terminal assembly 10 in disregard of its thickness.

The terminal assembly 10 includes a first connection conductor 14 and a second connection conductor 24, which are linked to each other with link sections 34 therebetween. The first connection conductor 14 in the present embodiment includes a first plate-shaped conductor 14a, first terminal sections 14b, and first support sections 14c. The second connection conductor 24 includes a second plate-shaped conductor 24a, second terminal sections 24b, and second support sections 24c. The terminal assembly 10 may, for example, be obtained from an electrically conductive plate. More specifically, the electrically conductive plate is partly removed by punching or etching and is formed into the terminal assembly 10 including two connection conductors 4. The terminal assembly 10 is then bent as illustrated in FIG. 4.

Referring to FIG. 4, the first connection conductor 14 and the second connection conductor 24 of the terminal assembly 10 face each other. Each of the link sections 34 links a tip portion (an upper end portion in FIG. 4) of the corresponding first terminal section 14b to a tip portion (an upper end portion in FIG. 4) of the corresponding second terminal section 24b. Referring to FIGS. 4 and 5, the first connection conductor 14 in the present embodiment includes four first terminal sections 14b, and the second connection conductor 24 in the present embodiment includes four second terminal sections 24b. The terminal assembly 10 in the present embodiment includes four link sections 34.

Referring to FIG. 4, tip portions of the first support sections 14c of the terminal assembly 10 in the present embodiment are bent in a direction crossing (e.g., orthogonal to) a principal surface of the first plate-shaped conductor 14a so as to extend away from the first plate-shaped conductor 14a. Likewise, tip portions of the second support sections 24c are bent in a direction crossing (e.g., orthogonal to) a principal surface of the second plate-shaped conductor 24a so as to extend away from the second plate-shaped conductor 24a.

Referring to FIG. 6, the terminal assembly 10 in the present embodiment includes the resin block 20, which holds the first plate-shaped conductor 14a, the first terminal sections 14b, and the link sections 34. The resin block 20 is a rectangular parallelepiped and is made of resin. The first plate-shaped conductor 14a, the first terminal sections 14b, and the link sections 34 are arranged along the surfaces around the perimeter of the resin block 20. This layout eliminates or reduces the possibility that stress will be exerted on one end of the first connection conductor 14. The first connection conductor 14 and the first terminal sections 14b are thus impervious to being damaged. The first plate-shaped conductor 14a, the first terminal sections 14b, and the link sections 34 may be located outside the resin block 20 and arranged along the surfaces around the perimeter of the resin block 20 or may be located within the resin block 20 and arranged along the surfaces around the perimeter of the resin block 20.

The first connection conductor 14 of the terminal assembly 10 according to the present embodiment includes the first terminal sections 14b. The first terminal sections 14b extend from the first plate-shaped conductor 14a and away from one of two opposite end portions of the first plate-shaped conductor 14a and are arranged side by side. The first terminal sections 14b provided to the first plate-shaped conductor 14a are arranged side by side, with a space being provided therebetween and being filled with the sealing resin 5. The adhesion of the first connection conductors 14 to the sealing resin 5 is thus enhanced such that the first connection conductors 14 are less likely to slip out of the sealing resin 5. As illustrated in FIGS. 4 and 5, the first terminal sections 14b provided to the first plate-shaped conductor 14a are arranged side by side in the longitudinal direction of the first plate-shaped conductor 14a.

The terminal assembly 10 in the present embodiment also includes the resin block 20, which holds the first plate-shaped conductor 14a, the first terminal sections 14b, and the link sections 34. The first plate-shaped conductor 14a, the first terminal sections 14b, and the link sections 34 are arranged along the surfaces around the perimeter of the resin block 20. The link sections 34 are removed by polishing or the like in a state in which the first plate-shaped conductor 14a and the first terminal sections 14b are held by the resin block 20. The terminal assembly 10 may thus be mounted onto the circuit board 2 more easily than would be possible if the first plate-shaped conductor 14a and the first terminal sections 14b are handled independently of one another.

The second connection conductor 24 of the terminal assembly 10 according to the present embodiment includes the second terminal sections 24b. The second terminal sections 24b extend from the second plate-shaped conductor 24a and away from one of two opposite end portions of the second plate-shaped conductor 24a and are arranged side by side. Each of the link sections 34 links the tip portion of the corresponding first terminal section 14b to the tip portion of the corresponding second terminal section 24b, and the link sections 34 are arranged with a space therebetween. This layout enables smooth entry of the sealing resin 5 into the spaces between adjacent ones of the first terminal sections 14b and into the spaces between adjacent ones of the second terminal sections 24b. The adhesion of the first connection conductor 14 to the sealing resin 5 and the adhesion of the second connection conductor 24 to the sealing resin 5 are thus enhanced such that the first connection conductor 14 and the second connection conductor 24 are less likely to slip out of the sealing resin 5.

Production Method

The following describes, with reference to FIGS. 7 to 14, a method for producing the module 1 through the use of the terminal assembly 10. FIGS. 7 to 14 are sectional views, illustrating a method for producing a module 1 including electronic components 3 and connection conductors 4 on one of two opposite surfaces (i.e., on a front surface S1) and electronic components 3 and connection conductors 4 on the other surface (i.e., on a back surface S2). Note that electrodes on the front surface of the circuit board 2 and electrodes on the back surface of the circuit board 2 are not illustrated in FIGS. 7 to 14.

Figure 7:
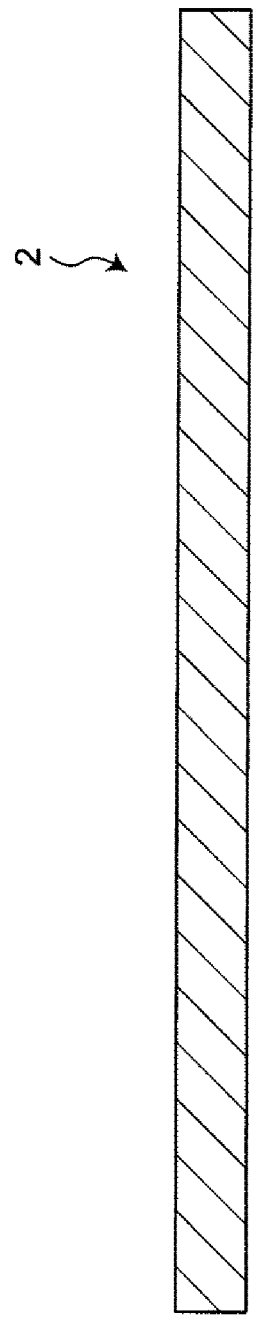
FIG. 7 is a sectional view, illustrating a method for producing a module according to an embodiment.

Referring to FIG. 7, a circuit board 2 is prepared.

Step of Mounting

Figure 8:
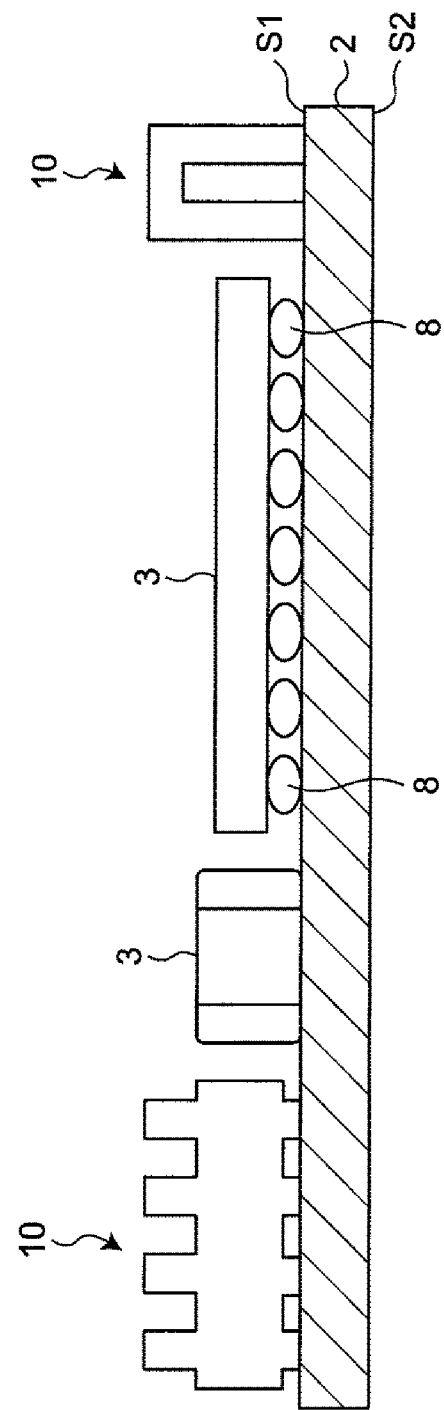
FIG. 8 is a sectional view, illustrating a step subsequent to the step illustrated in FIG. 7.

Referring to FIG. 8, electronic components 3 and terminal assemblies 10 are mounted onto the front surface S1 of the circuit board 2. The electronic components 3 and the terminal assemblies 10 in the present embodiment are electrically connected to electrodes 6 (not illustrated) on the front surface S1 of the circuit board 2, with a conductive bonding material 8 therebetween. The conductive bonding material 8 may be solder. The electronic components 3 and the terminal assemblies 10 may be mounted onto the circuit board 2 by using a well-known surface mount technology. For example, solder is applied to electrodes of interest (i.e., some of the electrodes 6 on the front surface S1 of the circuit board 2). The electronic components 3 and the terminal assemblies 10 are then mounted onto the corresponding electrodes 6 coated with solder and are subjected to a reflow process.

Step of Sealing with Resin

Figure 9:
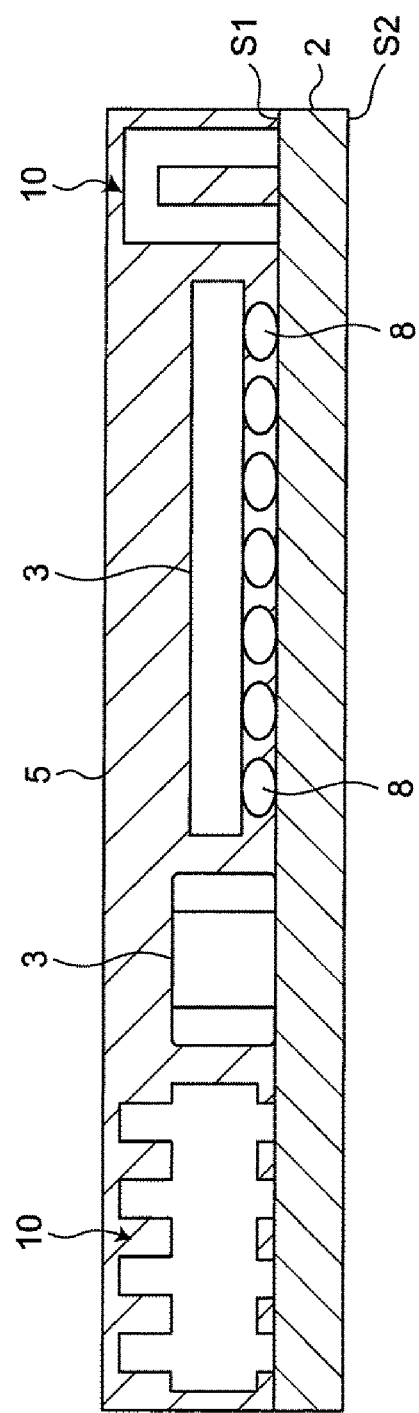
FIG. 9 is a sectional view, illustrating a step subsequent to the step illustrated in FIG. 8.

Referring to FIG. 9, the electronic components 3 and the terminal assemblies 10 on the front surface S1 of the circuit board 2 are then covered with sealing resin 5. Transfer molding, compression molding, or any other molding technique may be employed for the sealing resin 5.

Step of Removing Sealing Resin

Figure 10:
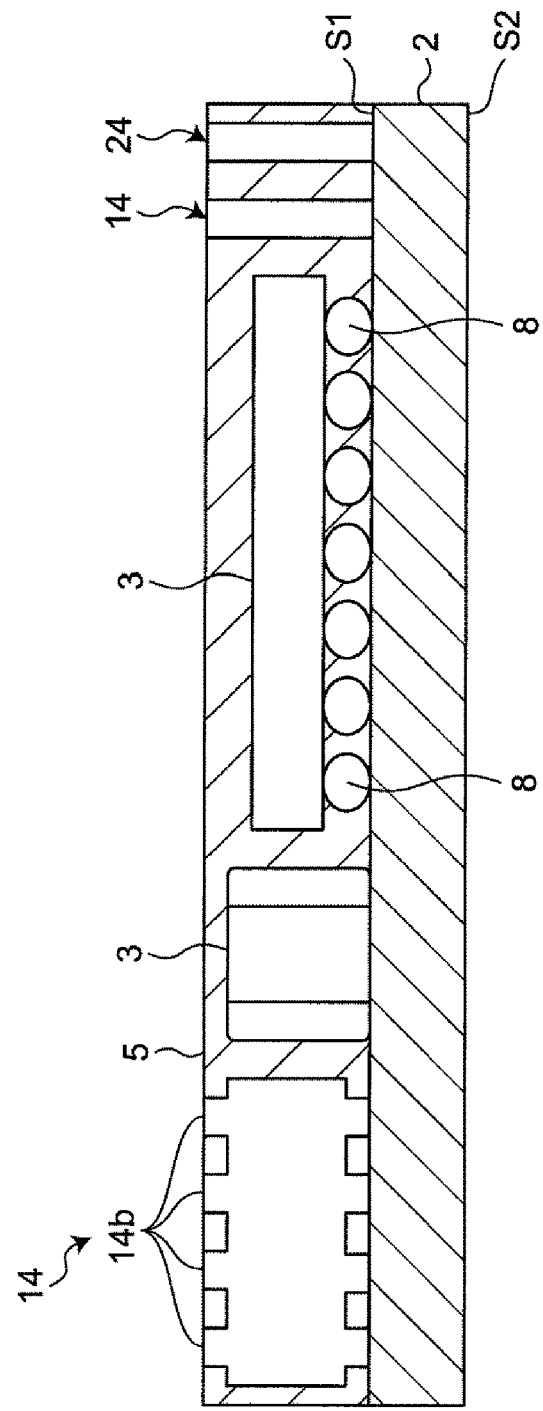
FIG. 10 is a sectional view, illustrating a step subsequent to the step illustrated in FIG. 9.

Referring to FIG. 10, a surface of the sealing resin 5 and the link sections 34 (see FIG. 4) of each of the terminal assemblies 10 are then removed. The link sections 34 may be removed by using a well-known polishing or grinding technique. With the link sections 34 being removed, the first connection conductor 14 and the second connection conductor 24 of each of the terminal assemblies 10 are disposed upright on the front surface S1 of the circuit board 2. When the link sections 34 are removed, the first terminal sections 14b of the first connection conductor 14 may each be partially removed such that the tip portions of the first terminal sections 14b are exposed at the surface of the sealing resin 5. This production method is advantageous in that the surface of the sealing resin 5 may be equal in level to the tip portions of the first terminal sections 14b of each of the connection conductors 4.

Figure 11:
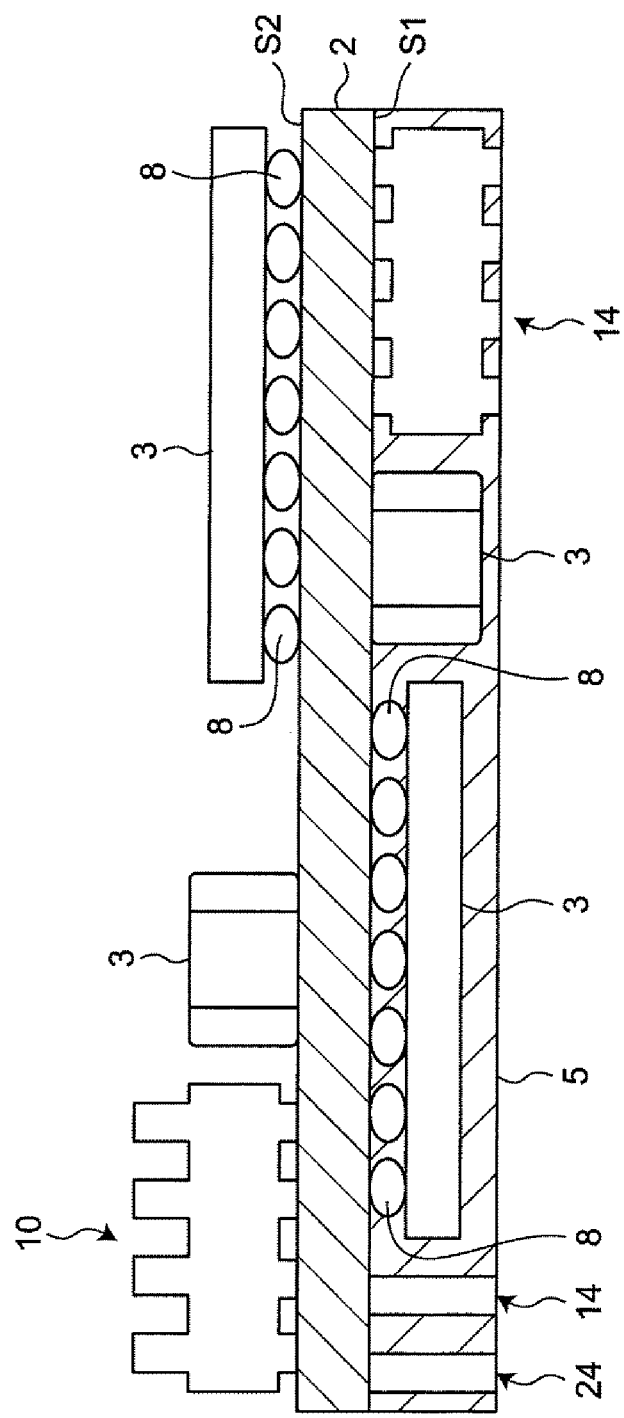
FIG. 11 is a sectional view, illustrating a step subsequent to the step illustrated in FIG. 10.

Referring to FIG. 11, electronic components 3 and terminal assemblies 10 are mounted onto the back surface S2 of the circuit board 2 in like manner with the electronic components 3 and the terminal assemblies 10 mounted onto the front surface S1 of the circuit board 2. The electronic components 3 and the terminal assemblies 10 in the present embodiment are electrically connected to electrodes 7 (not illustrated) on the back surface S2 of the circuit board 2, with a conductive bonding material 8 therebetween. The conductive bonding material 8 may be solder. The electronic components 3 and the terminal assemblies 10 may be mounted onto the circuit board 2 by using a well-known surface mount technology. For example, solder is applied to electrodes of interest (i.e., some of the electrodes 7 on the back surface S2 of the circuit board 2). The electronic components 3 and the terminal assemblies 10 are then mounted onto the corresponding electrodes 7 coated with solder and are subjected to a reflow process.

Figure 12:
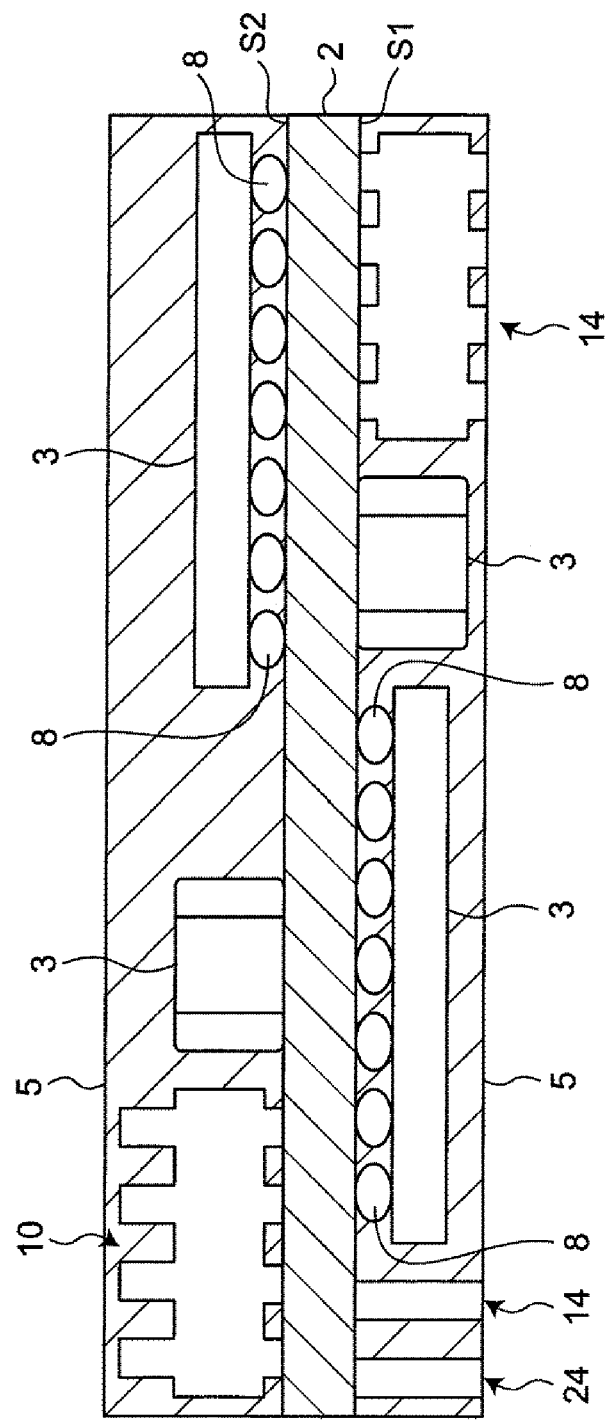
FIG. 12 is a sectional view, illustrating a step subsequent to the step illustrated in FIG. 11.

Referring to FIG. 12, the electronic components 3 and the terminal assemblies 10 on the back surface S2 of the circuit board 2 are then covered with sealing resin 5. Transfer molding, compression molding, or any other molding technique may be employed for the sealing resin 5.

Figure 13:
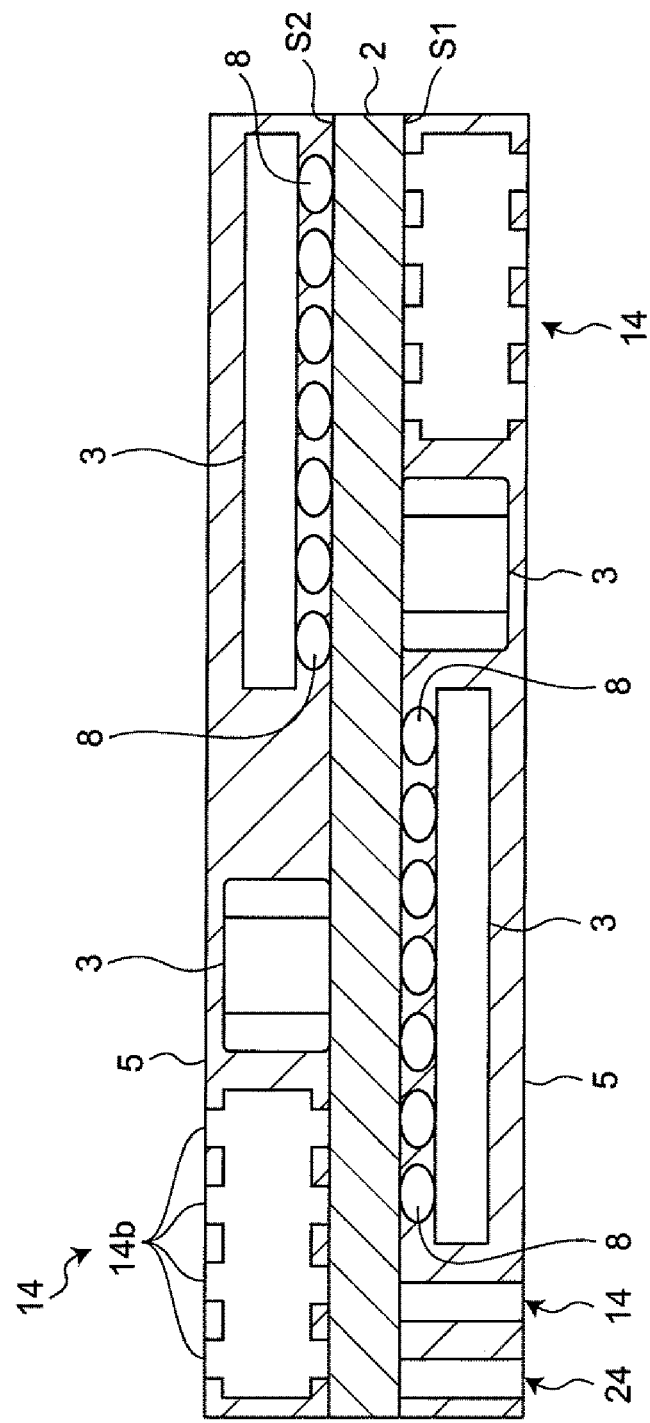
FIG. 13 is a sectional view, illustrating a step subsequent to the step illustrated in FIG. 12.

Referring to FIG. 13, a back surface S2 of the sealing resin 5 and the link sections 34 of each of the terminal assemblies 10 are then removed. The link sections 34 may be removed by using a well-known polishing or grinding technique. With the link sections 34 being removed, the first connection conductor 14 and the second connection conductor 24 of each of the terminal assemblies 10 are disposed upright on the front surface S1 of the circuit board 2. When the link sections 34 are removed, the first terminal sections 14b of the first connection conductor 14 may each be partially removed such that the tip portions of the first terminal sections 14b are exposed at the surface of the sealing resin 5.

Figure 14:
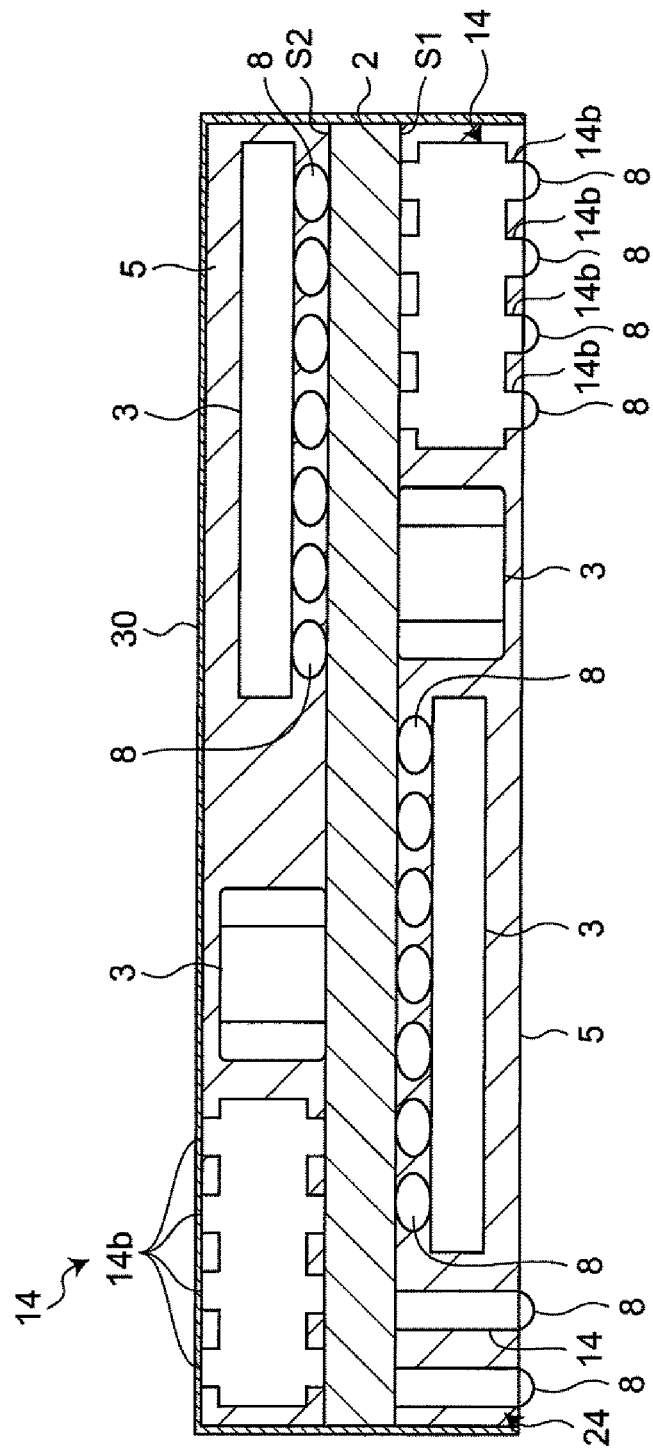
FIG. 14 is a sectional view, illustrating a step subsequent to the step illustrated in FIG. 13.

Referring to FIG. 14, a shield conductor 30 is formed on the surfaces of the sealing resin 5 on the back surface S2 of the circuit board 2 and on side surfaces of the sealing resin 5 on the front surface S1 of the circuit board 2. The electronic components 3 shielded by the shield conductor 30 are impervious to extraneous noise. The shield conductor 30 also suppresses the leakage of the noise produced by the electronic components 3. The shield conductor 30 may be formed on the surfaces of each sealing resin 5 by, for example, sputtering or application of paste. It is required that the shield conductor 30 be made of a conductive material. For example, the shield conductor 30 may be made of metal such as Cu, Au, Ag, or SUS. The shield conductor 30 is electrically connected to the first terminal sections 14b that are exposed. A conductive bonding material 8 is then applied to the first terminal sections 14b of each of the first connection conductors 14 on the back surface of the circuit board 2. The conductive bonding material 8 may be solder. The first terminal sections 14b of each of the first connection conductors 14 are then connected to electrodes on a motherboard or the like, with the conductive bonding material 8 therebetween.

The method for producing the module 1 according to the present embodiment includes the step of preparing the terminal assemblies 10. The terminal assemblies 10 each include the first terminal sections 14b, which extend from the first plate-shaped conductor 14a and away from the end portion E1 of the first plate-shaped conductor 14a and are arranged side by side. This production method offers the following advantage. The first terminal sections provided to the first plate-shaped conductor 14a are arranged side by side, with a space being provided therebetween and being filled with resin. The adhesion of the first connection conductors 14 to the resin is thus enhanced such that the first connection conductors 14 are less likely to slip out of the resin.

Another feature of the method for producing the module 1 according to the present embodiment is that the terminal assemblies 10 each include the resin block 20, which holds the first plate-shaped conductor 14a, the first terminal sections 14b, and the link sections 34. The first plate-shaped conductor 14a, the first terminal sections 14b, and the link sections 34 are arranged along the surfaces around the perimeter of the resin block 20. The link sections 34 are removed by polishing or the like in a state in which the first plate-shaped conductor 14a and the first terminal sections 14b are held by the resin block 20. Thus, this production method is advantageous in that the terminal assembly 10 may be mounted onto the circuit board 2 more easily than would be possible if the first plate-shaped conductor 14a and the first terminal sections 14b are handled independently of one another.

Still another feature of the method for producing the module 1 according to the present embodiment is in the step of preparing the terminal assemblies 10. More specifically, the second connection conductor 24 includes the second terminal sections 24b, which extend from the second plate-shaped conductor 24a and away from one of two opposite end portions of the second plate-shaped conductor 24a and are arranged side by side. Each of the link sections 34 links the tip portion of the corresponding first terminal section 14b to the tip portion of the corresponding second terminal section 24b, and the link sections 34 are arranged with a space therebetween. This production method enables smooth entry of the sealing resin 5 into the spaces between adjacent ones of the first terminal sections 14b and into the spaces between adjacent ones of the second terminal sections 24b. The adhesion of the first connection conductor 14 to the sealing resin 5 and the adhesion of the second connection conductor 24 to the sealing resin 5 are thus enhanced such that the first connection conductor 14 and the second connection conductor 24 are less likely to slip out of the sealing resin 5.

Modification 1

Figure 15:
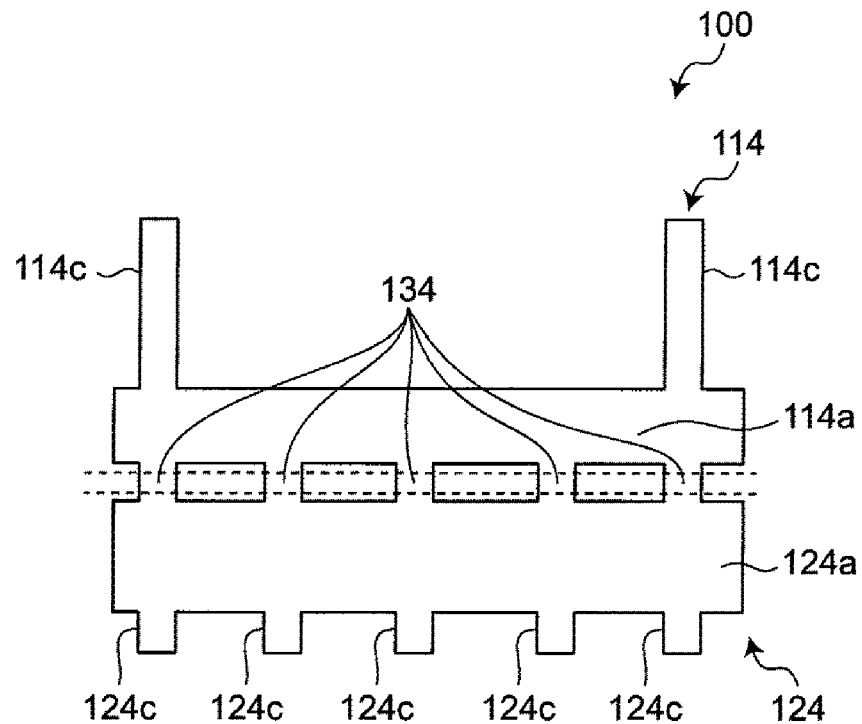
FIG. 15 is a development view of a terminal assembly in Modification 1.
Figure 16:
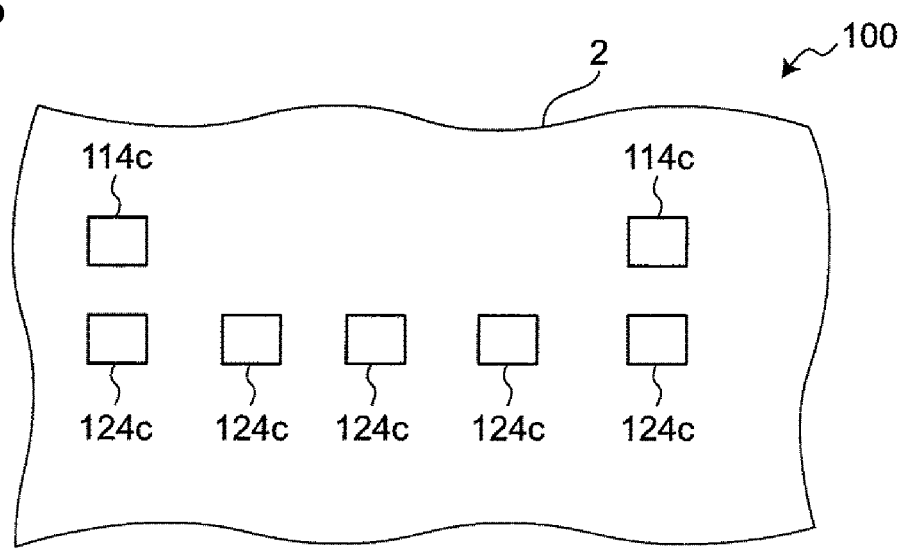
FIG. 16 illustrates sites where first support sections of a first connection conductor are connected to a circuit board and sites where second support sections of a second connection conductor are connected to the circuit board.

The following describes a modification of the terminal assembly with reference to FIGS. 15 and 16. FIG. 15 is a development view of a terminal assembly 100 in Modification 2. FIG. 16 illustrates sites where first support sections 114c of a first connection conductor 114 are connected to the circuit board 2 and sites where second support sections 124c of a second connection conductor 124 are connected to the circuit board 2. The dotted lines in FIG. 15 denote portions that are to be removed from link sections. The first connection conductor 114 and the second connection conductor 124 are obtained by removing a link section 134 after the terminal assembly 100 is mounted onto the circuit board 2. Referring to FIG. 16, which illustrates the terminal assembly 100, the space between the first support sections 114c is wider than the space between adjacent ones of the second support sections 124c. As can be seen from FIG. 16, it is easily ensured that the space for the electronic components 3 (see FIG. 1) and the space for wiring patterns (not illustrated) on the circuit board 2 are left between the first support sections 114c.

Modification 2

Figure 17:
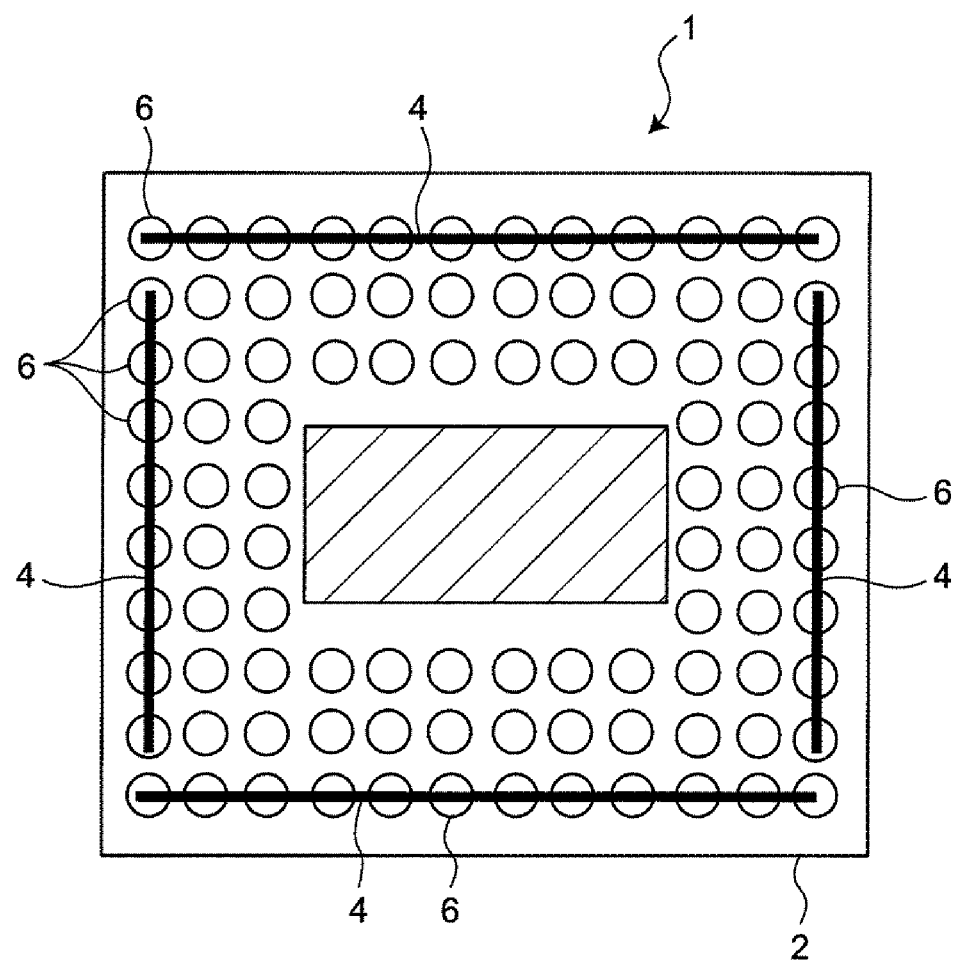
FIG. 17 is a plan view of a module in Modification 2.

The following describes a modification of the module 1 with reference to FIG. 17. FIG. 17 is a plan view of the module 1 in Modification 2. For convenience, the connection conductors 4 are denoted by the respective thick lines in FIG. 17. When the module 1 in Modification 2 is viewed in plan, the connection conductors 4 are connected to some of the electrodes 6 on the front surface S1 (see FIG. 14) of the circuit board 2 or, more specifically, to the outermost electrodes 6. It is thus ensured that a wider space is left for the electronic component 3 between the connection conductors 4 disposed on the outermost electrodes 6 on the circuit board 2. In a case that the coefficient of linear expansion of the connection conductors 4 is smaller than the coefficient of linear expansion of the insulating material from which the circuit board 2 is made, the connection conductors 4 connected to the outermost electrodes 6 on the circuit board 2 eliminate or reduce the possibility that the circuit board 2 will become warped; that is, the connection conductors 4 make the circuit board 2 resistant to warping. The circuit board 2 is preferably provided with the connection conductors 4 arranged in more than one direction such that the circuit board 2 becomes more resistant to warping.

Modification 3

Figure 18:
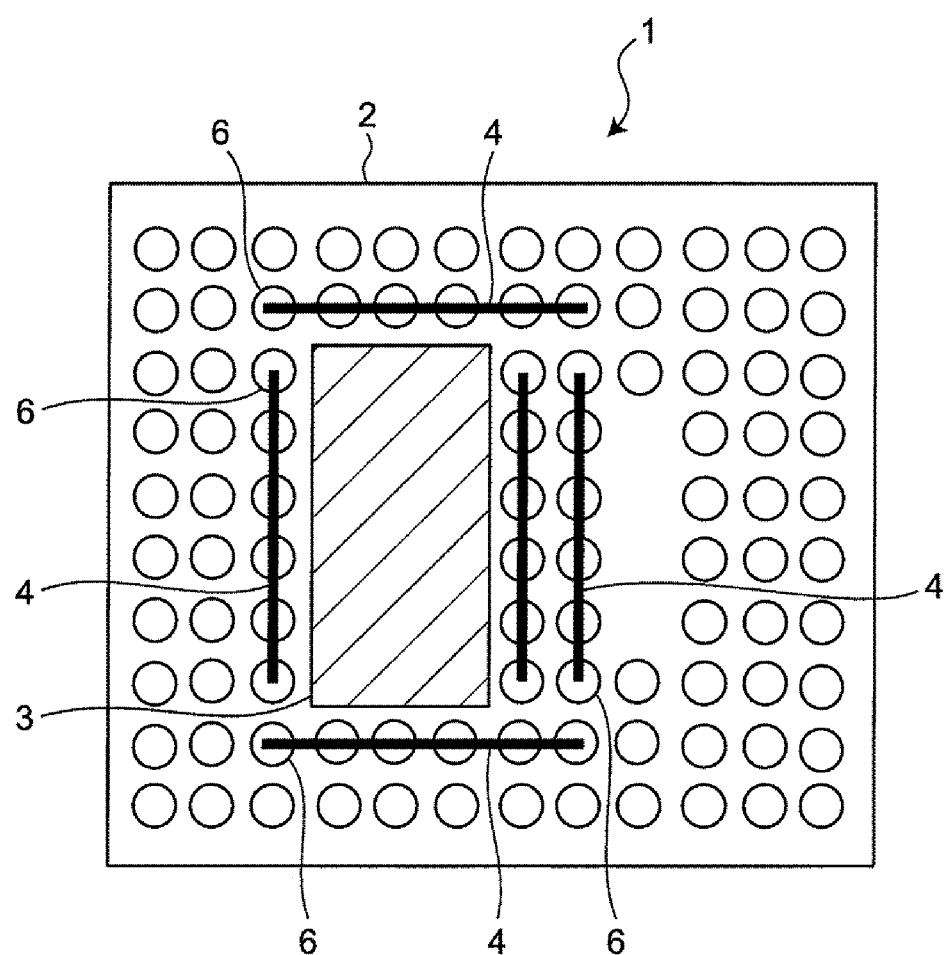
FIG. 18 is a plan view of a module in Modification 3.

The following describes still another modification of the module 1 with reference to FIG. 18. FIG. 18 is a plan view of the module 1 in Modification 3. For convenience, the connection conductors 4 are denoted by the respective thick lines in FIG. 18. When the module 1 in Modification 3 is viewed in plan, the connection conductors 4 are arranged in a manner so as to surround the electronic component 3. The connection conductors 4 preferably have a thermal conductivity higher than that of the sealing resin (see FIG. 1). Placing the connection conductors 4 around high-heat-producing electronic components (e.g., IC components) is conducive to enhancing the dissipation of the heat. It is not required that the connection conductors 4 surrounding the electronic component 3 be arranged without a gap therebetween; that is, clearance may be created in some places.

Modification 4

Figure 19:
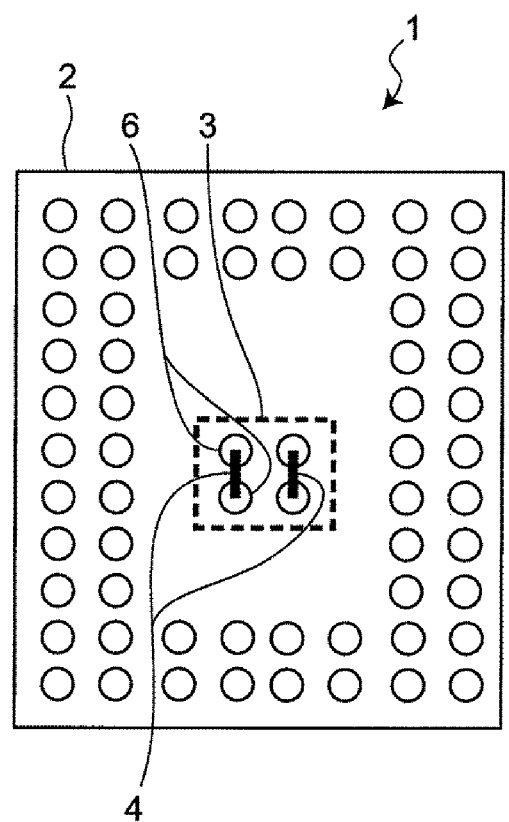
FIG. 19 is a plan view of a module in Modification 4.

The following describes still another modification of the module 1 with reference to FIG. 19. FIG. 19 is a plan view of the module 1 in Modification 4. The module 1 illustrated in FIG. 19 includes at least the circuit board 2, the electronic component 3 on the front surface S1 (see FIG. 14) of the circuit board 2, and the connection conductors 4 on the back surface S2 (see FIG. 14) of the circuit board 2. Referring to FIG. 19, when the module 1 is viewed in plan from the side on which the back surface S2 is located, the connection conductors 4 mounted on the back surface S2 of the circuit board 2 are at least partly located within the electronic component 3 mounted on the front surface S1 of the circuit board 2. This layout is conducive to enhancing the dissipation of the heat. More specifically, the heat produced by the electronic component 3 mounted on the front surface S1 of the circuit board 2 is transferred through the circuit board 2 to the connection conductors 4 mounted on the back surface S2 of the circuit board 2.

Modification 5

Figure 20:
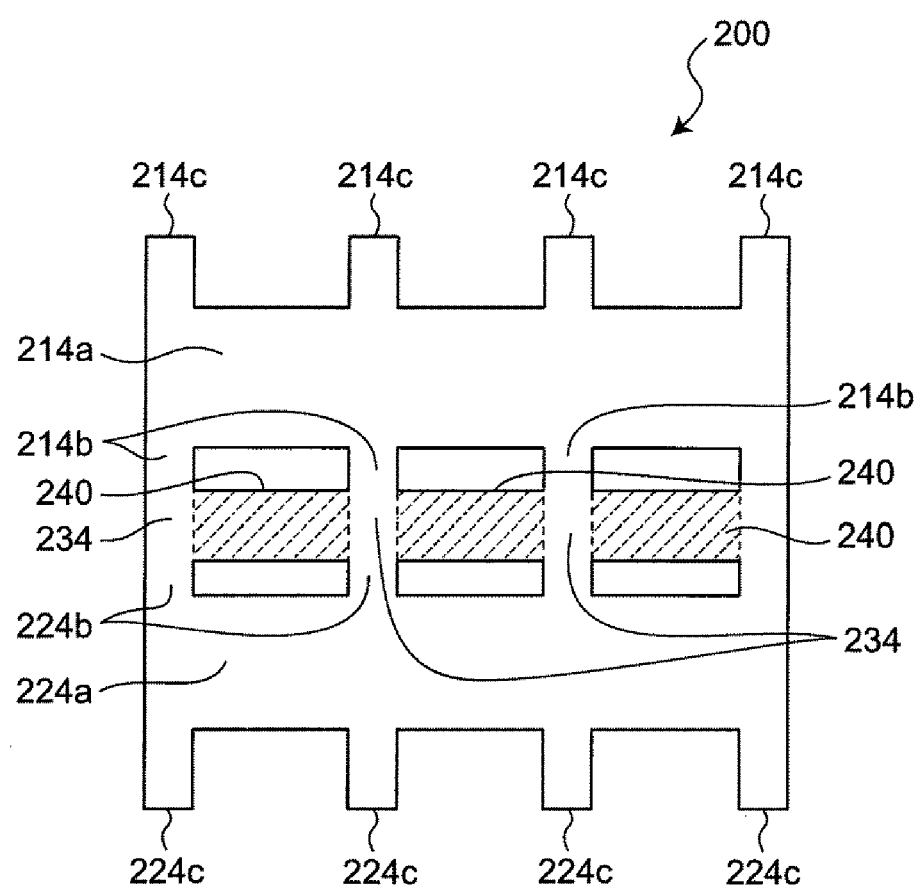
FIG. 20 is a development view of a terminal assembly in Modification 5.

The following describes a modification of the terminal assembly 10 with reference to FIG. 20. FIG. 20 is a development view of a terminal assembly 200 in Modification 5. The terminal assembly 200 illustrated in FIG. 20 differs from the terminal assembly 10 illustrated in FIG. 5 in that link sections 234 are connected to each other by a suction part 240. The terminal assembly 200 can be sucked by a mounter (not illustrated) without the need for the suction area of the link sections 234 because the lack of suction area may be compensated for by the suction part 240. The suction part 240 is sucked by the mounter such that the terminal assembly 200 is easily mounted onto the circuit board 2 in a stable manner.

Modification 6

Figure 21:
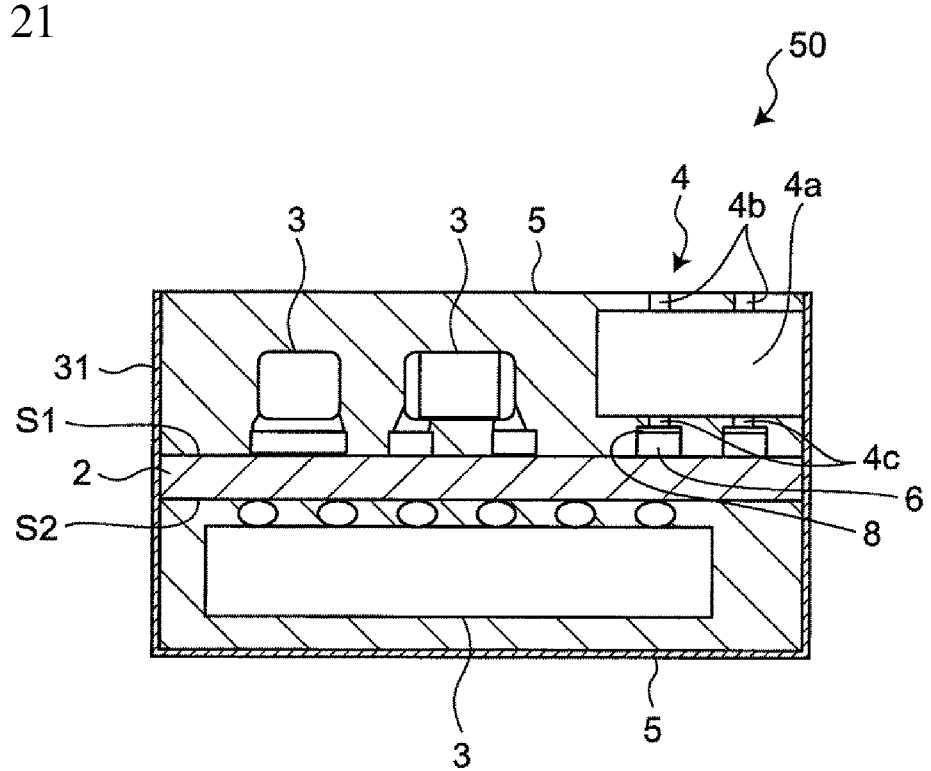
FIG. 21 is a sectional view of a module produced by a production method in Modification 6.
Figure 22:
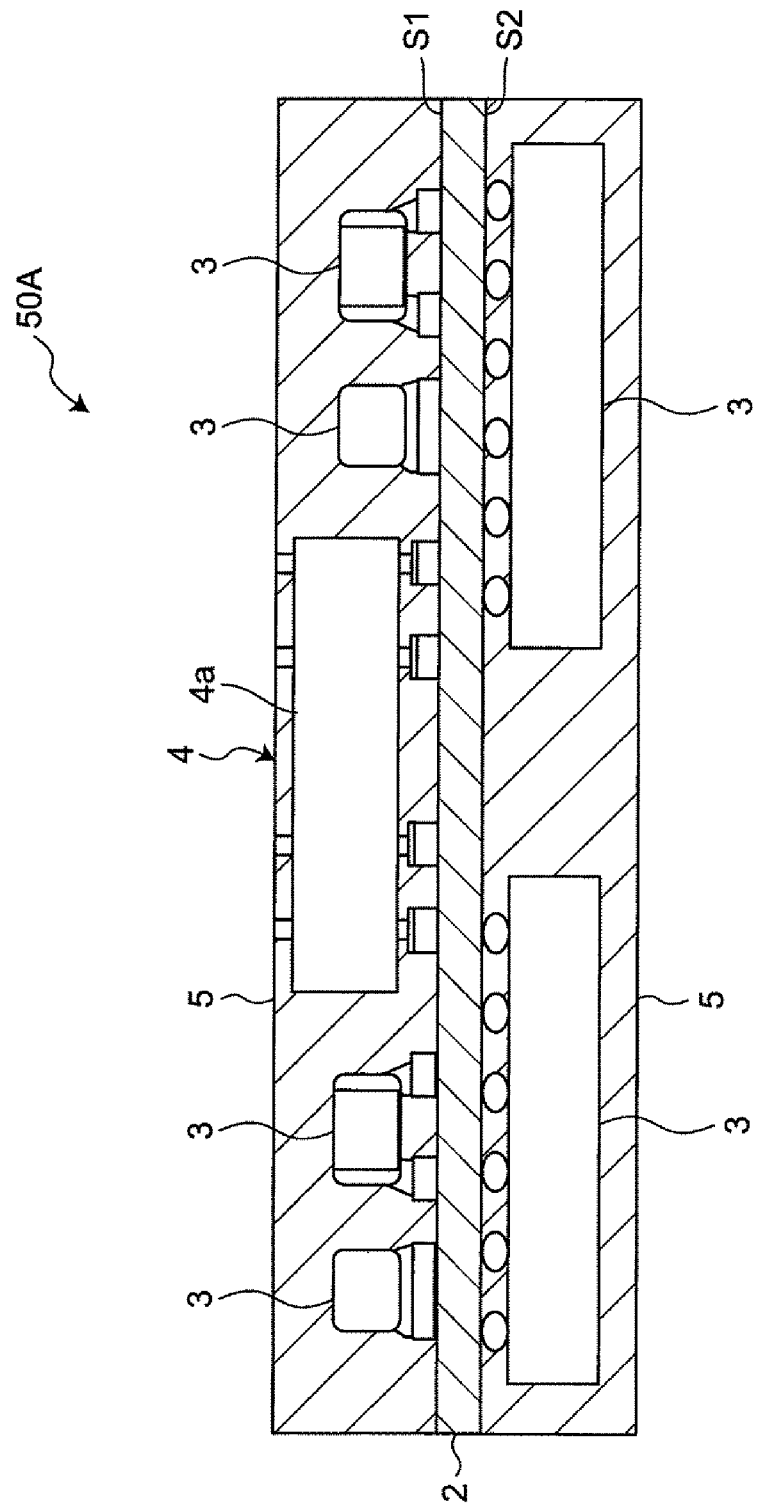
FIG. 22 is a sectional view, illustrating a method for producing the module illustrated in FIG. 21.
Figure 23:
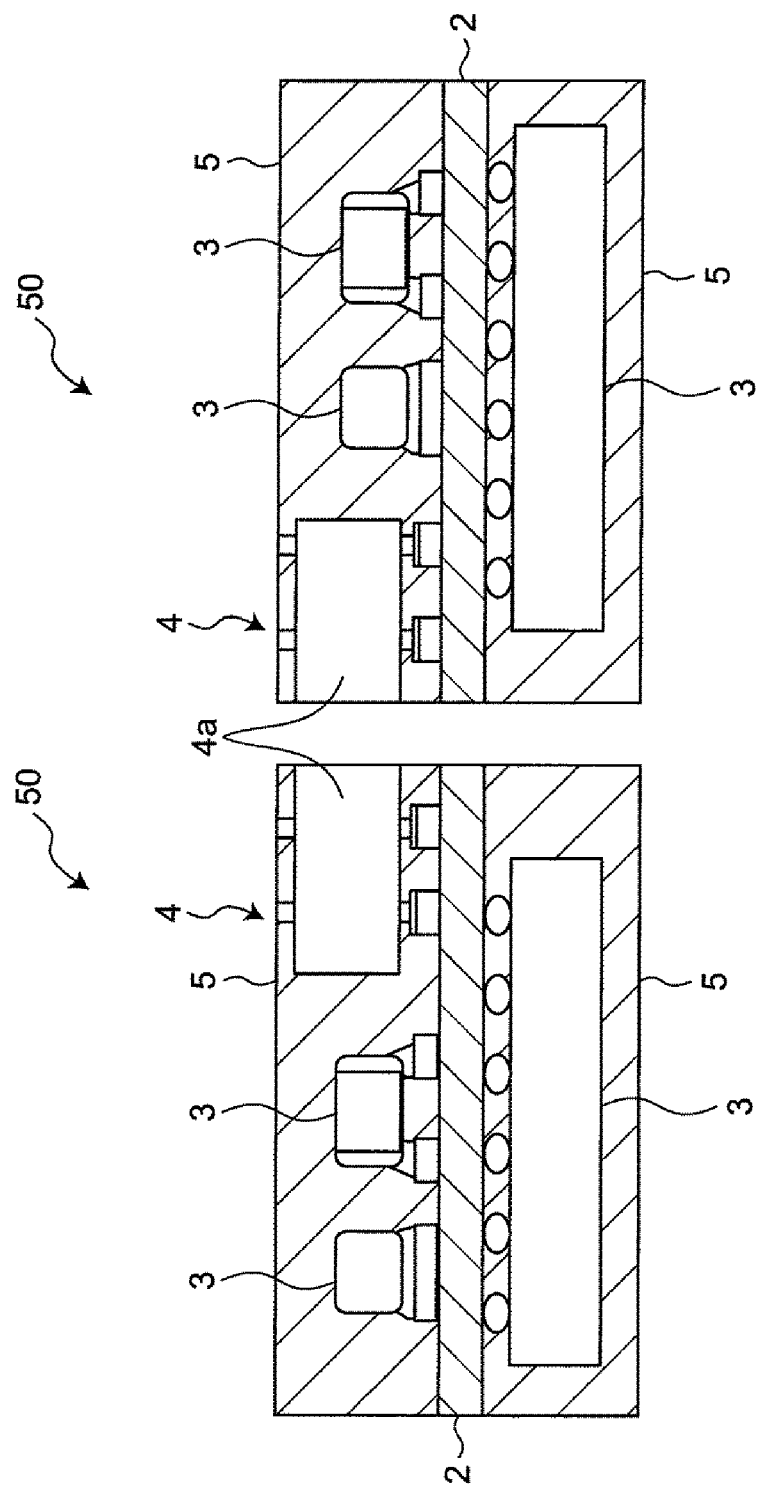
FIG. 23 is a sectional view, illustrating a step subsequent to the step illustrated in FIG. 22.
Figure 24:
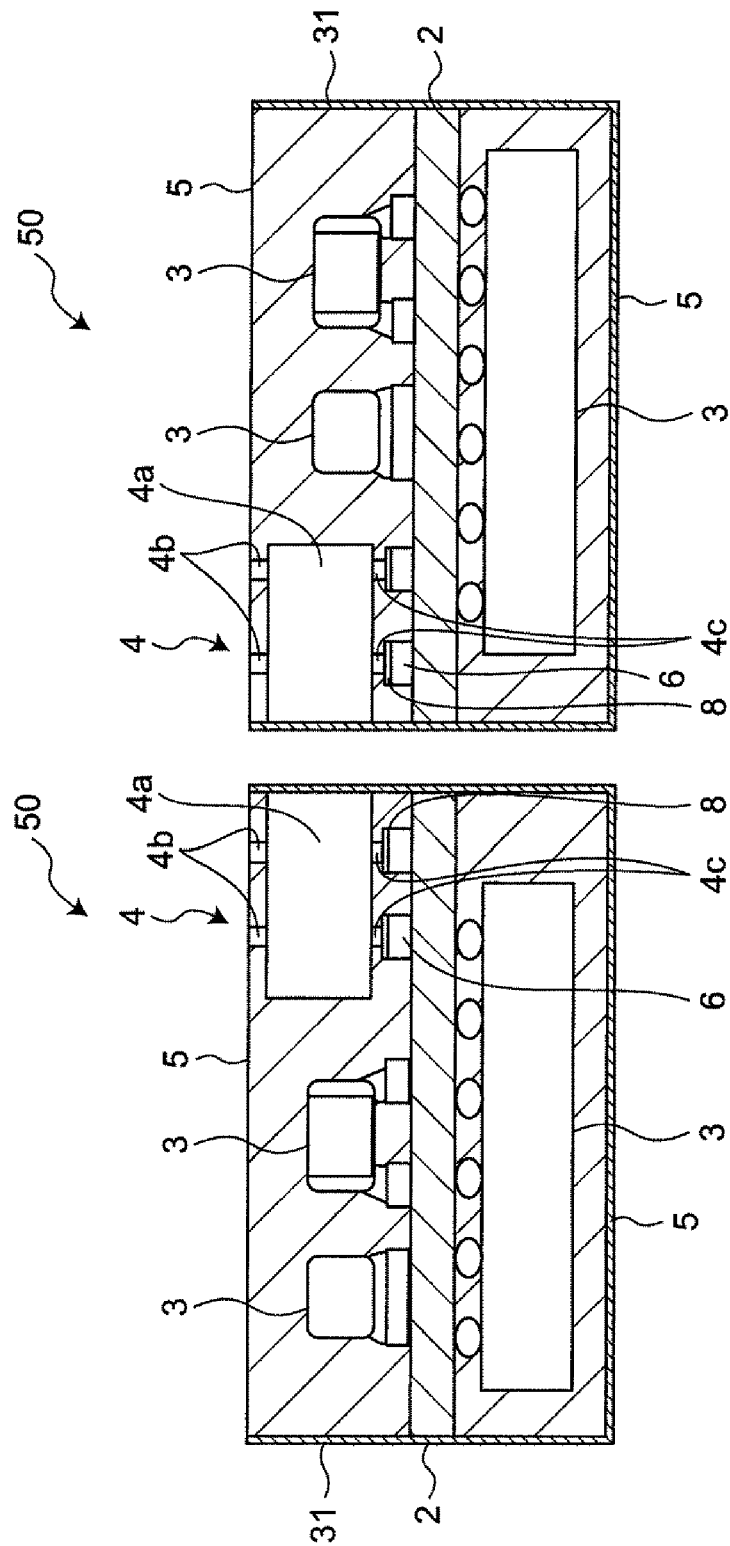
FIG. 24 is a sectional view, illustrating a step subsequent to the step illustrated in FIG. 23.

The following describes a modification of the method for producing a module, with reference to FIGS. 21, 22, 23, and 24. The module in this modification is denoted by 50. FIG. 21 is a sectional view of the module 50 produced by a production method in Modification 6. FIGS. 22, 23, and 24 are sectional views, illustrating a method for producing the module 50.

The module 50 produced by the production method in Modification 6 illustrated in FIG. 21 will be described below. The module 50 includes a circuit board 2, a connection conductor 4 on a front surface S1 of the circuit board 2, electronic components 3 on the front surface S1 of the circuit board 2, and electronic components 3 on a back surface S2 of the circuit board 2. The module 50 in Modification 6 differs from the module 1 illustrated in FIG. 14 in that a side surface of the plate-shaped conductor 4a is connected to the shield conductor 31. The area of contact between the plate-shaped conductor 4a and the shield conductor 31 is greater than the area of the tip portions of the terminal sections 4b exposed at the surface of the sealing resin 5. The stability of the ground potential may be improved more in the state in which the shield conductor 31 is connected to the plate-shaped conductor 4a of the connection conductor 4 as illustrated in FIG. 21 than in the state in which the shield conductor 31 is connected to the terminal sections 4b of the connection conductor 4 as illustrated in FIG. 14. The plate-shaped conductor 4a and the shield conductor 31 are connected to each other such that the connection conductor 4 is much less likely to slip out of the sealing resin 5.

Referring to FIG. 22, a parent board 50A is prepared. More specifically, a connection conductor 4 and electronic components 3 are sealed with sealing resin 5 and are mounted onto the front surface S1 of the circuit board 2. Likewise, electronic components 3 are sealed with sealing resin 5 and are mounted onto the back surface S2 of the circuit board 2. The parent board 50A includes more than one module 50, which will be described later. Referring to FIG. 23, the parent board 50A is cut in the thickness direction of the circuit board 2 in such a manner that the plate-shaped conductor 4a of the connection conductor 4 is divided into two. Referring to FIG. 24, a shield conductor 31 is formed on the surfaces of two modules 51 obtained by dividing the parent board 50A and is also formed on the exposed surfaces of the connection conductor 4. The shield conductor 31 is electrically conductive and may be formed by using a sputtering machine or a vacuum evaporator. This production method, in which the parent board 50A is cut in such a way as to expose the connection conductor 4, is advantageous in that an electrical connection is easily formed between the shield conductor 31 and the connection conductor 4.

Modification 7

Figure 25:
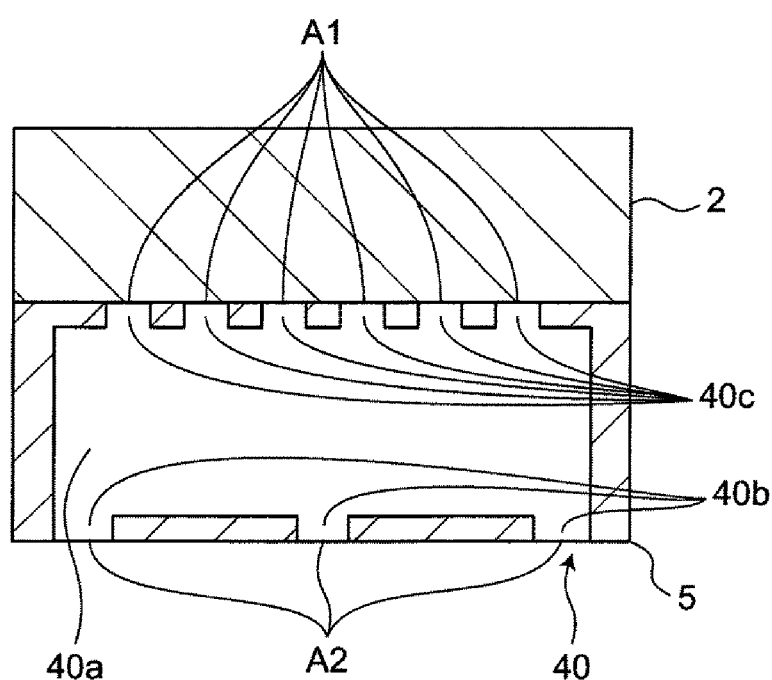
FIG. 25 is a sectional view of connection conductors in Modification 7.

The following describes a modification of the connection conductor 4 with reference to FIG. 25. FIG. 25 is a sectional view of the connection conductor 4 in Modification 7. Referring to FIG. 25, the connection conductor in Modification 7 is denoted by 40 and includes a plate-shaped conductor 40a, terminal sections 40b, and support sections 40c. The terminal sections 40b are provided to the plate-shaped conductor 40a and extend away from one of the principal surfaces of the circuit board 2. The support sections 40c are provided to the plate-shaped conductor 40a and extend toward the principal surface of the circuit board 2. The tip portions of the support section 40c may be connected to the electrodes 6 on the circuit board 2, with the conductive bonding material 8 therebetween. The conductive bonding material 8 may be solder. Alternatively, the tip portions of the support section 40c may be in direct contact with the electrodes 6 on the circuit board 2 and may be electrically connected to the electrodes 6 accordingly. In Modification 7, the gross area of the regions where the support sections 40c are in contact with the electrodes 6 on the circuit board 2 is greater than the gross area of the regions where the tip portions of the terminal sections 40b are exposed at the surface of the sealing resin 5. The increase in the area of regions where the support sections 40c are in contact with the electrodes 6 leads to an enhancement of the adhesion between the connection conductor 40 and the electrodes 6 on the circuit board 2. As a result, the connection conductor 40 is less likely to slip out of the sealing resin 5. As illustrated in FIG. 25, the space between the terminal sections 40b in the longitudinal direction of the plate-shaped conductor 40a is greater than the space between the support sections 40c in the longitudinal direction of the plate-shaped conductor 40a.

While the present disclosure has been thoroughly described so far by way of preferred embodiments with reference to the accompanying drawings, variations and modifications will be apparent to those skilled in the art. It should be understood that the variations and modifications made without departing from the scope hereinafter claimed are also embraced by the present disclosure. Constituent elements described in the embodiments above may be used in varying combinations or may be placed in varying orders without departing from the scope of the present disclosure and from ideas disclosed herein.

The present disclosure is applicable to modules and terminal assemblies that are to be mounted on, for example, a motherboard of a communication mobile terminal. The present disclosure is also applicable to a method for producing a module that is to be mounted on, for example, a motherboard of a communication mobile terminal.

1, 50 module
  2 circuit board
  3 electronic component
  4, 40 connection conductor
  4a, 40a plate-shaped conductor
  4b, 40b terminal section
  4c, 40c support section
  5 sealing resin
  6 electrode on a front surface of the circuit board 2
  7 electrode on a back surface of the circuit board 2
  8 conductive bonding material
  10, 100, 200 terminal assembly
  14, 114, 214 first connection conductor
  14a, 114a, 214a first plate-shaped conductor
  14b, 114b, 214b first terminal section
  14c, 114c, 214c first support section
  20 resin block
  24, 124, 224 second connection conductor
  24a, 124a, 224a second plate-shaped conductor
  24b, 124b, 224b second terminal section
  24c, 124c, 224c second support section
  30, 31 shield conductor
  34, 134, 234 link section
  50A parent board

The invention claimed is:

1. A module, comprising:
  a circuit board;
  an electronic component on one principal surface of the circuit board;
  a connection conductor on the one principal surface of the circuit board; and
  a sealing resin on the one principal surface of the circuit board, the electronic component and the connection conductor being covered with the sealing resin, wherein
  the connection conductor includes a plate-shaped conductor and terminal sections,
  the plate-shaped conductor is disposed upright on the one principal surface of the circuit board,
  the terminal sections extend from the plate-shaped conductor and away from the one principal surface of the circuit board and are arranged side by side, and
  tip portions of the terminal sections are exposed at a surface of the sealing resin.

2. The module according to claim 1, wherein
  the connection conductor includes support sections extending from the plate-shaped conductor toward the one principal surface of the circuit board and arranged side by side, and
  the support sections are electrically connected to an electrode on the circuit board.

3. The module according to claim 2, wherein a gross area of regions where the support sections are in contact with the electrode is greater than a gross area of regions where the tip portions of the terminal sections are exposed at the surface of the sealing resin.

4. A terminal assembly, comprising:
  a first connection conductor including a first plate-shaped conductor;
  a second connection conductor including a second plate-shaped conductor facing the first plate-shaped conductor; and
    the first connection conductor including first terminal sections extending from the first plate-shaped conductor and away from one of two opposite end portions of the first plate-shaped conductor and arranged side by side,
  link sections linking tips of the first terminal sections to the second connection conductor and arranged with a space therebetween.

5. The terminal assembly according to claim 4, wherein
  the second connection conductor includes second terminal sections extending from the second plate-shaped conductor and away from one of two opposite end portions of the second plate-shaped conductor and arranged side by side, and
  the link sections link the tip portions of the first terminal sections to tip portions of the second terminal sections and are arranged with a space therebetween.

6. The terminal assembly according to claim 4, further comprising a resin block holding the first plate-shaped conductor, the first terminal sections, and the link sections, wherein
  the first plate-shaped conductor, the first terminal sections, and the link sections are arranged along surfaces around a perimeter of the resin block.

7. A method for producing a module, comprising the steps of:
  preparing a terminal assembly including
    a first connection conductor including a first plate-shaped conductor,
    a second connection conductor including a second plate-shaped conductor,
    first terminal sections extending from the first plate-shaped conductor and away from one of two opposite end portions of the first plate-shaped conductor and arranged side by side, and link sections linking tip portions of the first terminal sections to one of two opposite end portions of the second connection conductor and arranged with a space therebetween;

mounting the terminal assembly in such a manner that another one of the two opposite end portions of the first connection conductor and another one of the two opposite end portions of the second connection conductor are connected to one principal surface of a circuit board and mounting an electronic component onto the one principal surface of the circuit board;

sealing the electronic component and the terminal assembly with a resin; and removing the resin and the link sections to expose the tip portions of the first terminal sections at a surface of the resin.

8. The method for producing a module according to claim 7, wherein
the terminal assembly further includes a suction part connecting the link sections to each other,
the step of mounting includes sucking the suction part to mount the terminal assembly onto the circuit board, and
the step of removing the resin includes removing the link sections and the suction part.

9. The method for producing a module according to claim 7, wherein
the terminal assembly includes a resin block holding the first plate-shaped conductor, the first terminal sections, and the link sections, and
the first plate-shaped conductor, the first terminal sections, and the link sections are arranged along surfaces around a perimeter of the resin block.

10. The method for producing a module according to claim 7, wherein
in the step of preparing the terminal assembly, the second connection conductor includes second terminal sections extending from the second plate-shaped conductor and away from one of two opposite end portions of the second plate-shaped conductor and arranged side by side, and
the link sections link the tip portions of the first terminal sections to tip portions of the second terminal sections and are arranged with a space therebetween.

11. The terminal assembly according to claim 5, further comprising a resin block holding the first plate-shaped conductor, the first terminal sections, and the link sections, wherein
the first plate-shaped conductor, the first terminal sections, and the link sections are arranged along surfaces around a perimeter of the resin block.

12. The method for producing a module according to claim 8, wherein
the terminal assembly includes a resin block holding the first plate-shaped conductor, the first terminal sections, and the link sections, and
the first plate-shaped conductor, the first terminal sections, and the link sections are arranged along surfaces around a perimeter of the resin block.

13. The method for producing a module according to claim 8, wherein
in the step of preparing the terminal assembly, the second connection conductor includes second terminal sections extending from the second plate-shaped conductor and away from one of two opposite end portions of the second plate-shaped conductor and arranged side by side, and
the link sections link the tip portions of the first terminal sections to tip portions of the second terminal sections and are arranged with a space therebetween.

14. The method for producing a module according to claim 9, wherein
in the step of preparing the terminal assembly, the second connection conductor includes second terminal sections extending from the second plate-shaped conductor and away from one of two opposite end portions of the second plate-shaped conductor and arranged side by side, and
the link sections link the tip portions of the first terminal sections to tip portions of the second terminal sections and are arranged with a space therebetween.

* * * * *